United States Patent [19]

Walsh et al.

[11] Patent Number: 5,186,540
[45] Date of Patent: Feb. 16, 1993

[54] POWER MEASUREMENT CALORIMETER

[75] Inventors: Arthur L. Walsh, Westford, Mass.; Barry E. Genereux, Pascoag, R.I.

[73] Assignee: Raytheon Company, Lexington, Mass.

[21] Appl. No.: 815,717

[22] Filed: Dec. 30, 1991

[51] Int. Cl.⁵ ............................................. G01K 17/06
[52] U.S. Cl. ............................................ 374/32; 374/11
[58] Field of Search ....................... 374/32, 33, 34, 11

[56] References Cited

U.S. PATENT DOCUMENTS

| | | | |
|---|---|---|---|
| 2,560,536 | 7/1951 | Althouse | 374/32 X |
| 2,690,076 | 9/1954 | Hovnanian | 374/33 X |
| 3,059,471 | 10/1962 | Calvet | 374/33 X |
| 3,088,072 | 4/1963 | Clifford et al. | 374/32 |
| 3,464,267 | 9/1969 | Ehrlich et al. | 374/32 |
| 3,487,685 | 1/1970 | Shifrin | 374/32 |
| 4,492,480 | 1/1985 | Wadso et al. | 374/33 |
| 4,783,174 | 11/1988 | Gmelin et al. | 374/33 |

Primary Examiner—Daniel M. Yasich
Attorney, Agent, or Firm—Denis G. Maloney; Richard M. Sharkansky

[57] ABSTRACT

A calorimetric calibration system includes a thermoelectric calibration heat pump device disposed between fluid supplying inlet and outlet pipes coupled to the waterload. The calibration heat pump device provides a controlled delta temperature to the fluid flowing through the pipes for providing a standard of reference for the calibration of calorimetric measurement systems relying on the conversion of RF or microwave energy to heat. The thermoelectric calibration heat pump device consumes a relatively low electrical power, is small in size, inexpensive to manufacture, and is safe to operate.

4 Claims, 3 Drawing Sheets

POWER MEASUREMENT CALORIMETER

BACKGROUND OF THE INVENTION

This invention relates generally to measurement devices and more particularly to calorimetric devices for the measurement of radio frequency power.

As is known in the art, radio frequency (RF) power detectors operating on calorimetric principles are called calorimeters and are used typically in making high power RF measurements. Because most RF power detectors are incapable of dissipating power levels exceeding several hundred watts of average or pulsed power, calorimeter detectors are often used to provide a measurement of the incident RF power by converting the incident RF energy into thermal energy and equating the level of thermal energy to a known equivalent RF power level.

One type of measurement device widely used for measuring high RF power signals is the waterload. In using a waterload, the high level RF power is absorbed in a matched-impedance section of a transmission line that is wholly or partially filled with a flowing stream of liquid, usually water. It is generally desired that the liquid itself dissipate all of the incident power, so that the temperature difference between the liquid entering the load and the liquid leaving the load can be measured by calibrated thermocouples, thermistors, or thermometers. One of several techniques can then be used for relating the desired absolute RF power to the corresponding rise in temperature.

In one type of waterload, a water filled chamber is disposed at an end portion of a housing and input and output ports are provided to the chamber such that, a pressurized water supply is provided to the chamber. In this way, cool water is provided to the load through the input port and the heated water is removed from the chamber from the output port.

Mathematical expressions have been derived for relating a conversion of RF power to heat, and the levels of the RF power in the measurement device into thermal energy. One basic approach which may be used in conjunction with waterloads is discussed below.

As is known by those of ordinary skill in the art, the thermal capacity (c) of a substance is the number of calories (cal) needed to raise one gram (g) of the substance through a temperature change of one degree centigrade (C). The thermal capacity of water is 1 gal/g.°C. Therefore, in order to raise the temperature of a mass (m) having a thermal capacity (c) through a temperature change ($\Delta T$), the quantity (Q) of heat (in units of calories) required is:

$$Q = mc\Delta T$$

where c is the factor which relates the thermal capacity of the substance of mass m to the thermal capacity of water (c=1.0).

To determine the flow rate (f) of a fluid mass, the above relationship can be expressed as:

$$\frac{Q}{t} = \frac{mc\Delta T}{t}$$

Flow rates are generally expressed in units of cubic centimeters per second (cc/sec) or in gallons per minute (gpm). Since a calorie is equivalent to 4.186 joules, a watt is equal to a joule/sec, and a cubic centimeter of water is equal to a gram of water, the flow rate (f) in units of gallons per minute provides an expression for dissipated power (P) as:

$$P = f\left(\frac{263,997j}{\text{gal}^\circ \text{C.}}\right)\Delta T \text{ watts or}$$

$$P(KW) = .264 \times f(GPM) \times \Delta T(^\circ C.).$$

Accordingly, a direct relationship of measured power to temperature rise of the fluid at a given flow rate can be established.

The accuracy of the power measurement is dependant, to a large extent, on the ability of the waterload to absorb all of the incident RF energy and to transfer that energy into the fluid mass of the water passing through the absorbent element of the load. Energy either reflected away from the load or dissipated as heat external to the water will contribute to the inaccuracy of the measurement. For this reason, it is desired that the waterload have a voltage standing wave ratio (VSWR) characteristic that is as low as possible.

It is generally desirable that the measurement device or system used in making the measurement be calibrated so that the accuracy of the measurement can be relied upon.

One method of verifying the measurement accuracy of a waterload is to provide a power regulated heater element within the path of the water exiting the waterload for converting electrical power into heat. In other words, the necessary amount of power needed to raise the temperature of the water a desired amount, is the same at D.C. or any other frequency. For example, 100 watts of power at a frequency of 60 Hz, that is applied to the power regulated heater element will provide the same rise in temperature to the water as 100 watts of microwave power provided to the waterload assuming the frequency of the microwave power is within the operating bandwidth of the waterload.

A calorimetric measurement system, using a calorimetric waterload, generally will include the above-mentioned power regulated heater coupled to one of the pipes or hoses provided to the absorbent element of the waterload and a pair of temperature measurement devices, such as thermocouples, thermistors, or thermometers. One of the temperature measurement devices is disposed along the fluid supply line and the other along the fluid return line. The temperature measurement devices measure a temperature of the water entering and exiting the waterload to provide the reference delta temperature needed for calibration. The calorimetric measurement system will also generally include an automated calorimetric system controller or a DIGI-CAL calorimetric system. A DIGI-CAL system generally includes a housing for storing the necessary control instrumentation, such as the power regulator, as well as display readouts, front panel controls and interface buses needed for making automated computer measurements. The DIGI-CAL controller also generally includes a fluid storage tank required for containing the water supplied to the calorimetric waterload. One such DIGI-CAL calorimetric system controller is the Model No. ASTC-3000A-1, manufactured by the Raytheon Corporation, Waltham, Mass.

A typical calibration procedure for such a calorimetric system includes the supply of pressurized water to the calorimetric waterload at a desired flow rate until the system has been purged of any air trapped in the flow path. Power is applied to the power regulated heater, disposed to the outlet path of the waterload, at a level in the general range of the RF power expected to be measured. For example, if a transmitting source is expected to deliver 1 KW of RF power, 1 KW of power is applied to the regulated heater. When the DIGI-CAL display indicates that the system has reached a steady state condition, the temperature difference between the inlet and outlet paths to the waterload are sensed and sent to the DIGI-CAL to generate a reference measurement based on the direct heating of the liquid exiting the waterload. The power regulated heater is periodically referenced to a calibrated wattmeter which can be traced to and referenced with a National Institute of Standards and Technology (NIST) standard. The RF or microwave power signal is then applied to the waterload and an indication of the power measurement is observed at the DIGI-CAL controller.

However, for calorimeter measurements involving very high levels of microwave power (>1 KW), the power regulated heater used for calibration will also require the equivalent level of power. Providing such a high power system of this type is generally very expensive and can easily have a cost that exceeds the cost of the calorimeter system. Furthermore, providing power levels at these levels generally will provide a safety hazard to operators using the equipment. Moreover, because the heater element is generally required to be driven with a well regulated current source, the cost of such regulators can be expensive and will significantly increase the cost of the system.

SUMMARY OF THE INVENTION

In accordance with the present invention, an apparatus includes means for circulating a fluid, the means having a first path for receiving the fluid from a fluid source and a second path for returning the fluid to the fluid source. The apparatus further includes means, coupled to both of the first and second paths, for providing a difference in temperature between the first and second paths. With such an arrangement, the means for generating a temperature differential to the fluid flowing between the first and second paths provides a delta temperature reference standard which can be related to power and flow rate of a fluid in the first and second paths. A delta temperature standard provides a reference for calibrating a calorimetric power measurement system.

In accordance with a further aspect of the present invention, an apparatus includes means for circulating a fluid having a first path for receiving the fluid from a fluid source and a second path for returning the fluid to the fluid source. The apparatus further includes a thermoelectric device having a pair of plates coupled to respective ones of the first and second paths of the means for circulating a fluid and a plurality of thermocouples each comprising a bismuth antimony alloy disposed between said pair of plates. With such an arrangement, a thermoelectric device which in response to a current flow provides a temperature difference between the plates of the device, with the plates being coupled between the first and second paths of the fluid circulating means. The thermoelectric device can provide a desired temperature difference to the fluid passing through the first and second paths in response to a current fed to the device. Since the temperature differential is not provided by the generation of resistive heating, but by the interchanging of hot and cold junctions in response to a current flow, a relatively large temperature differential can be provided without the thermoelectric device requiring a high power input signal.

In accordance with a further aspect of the invention, a calorimetric calibration system includes absorbent means for receiving a radio frequency signal at a first power level and for dissipating said signal within a fluid. The absorbent means includes an inlet port for receiving the fluid to the absorbent means and an outlet port for allowing the fluid to exit the absorbent means. The calorimetric calibration system further includes means for circulating a fluid through the absorbent means having a first path for receiving the fluid from a fluid source and a second path for returning the fluid to the fluid source and sensing means, disposed between the first and second paths for sensing a difference in temperature therebetween and temperature generating means, coupled to the first and second paths and intermediate the absorbent means and sensing means, for providing a difference in temperature between the inlet and outlet ports of the absorbent means. The temperature generating means is responsive to a signal at a second power level with the power level being less than the first power level of the radio frequency signal. With such an arrangement, the calorimetric calibration system includes a temperature generating means for generating a controlled difference in temperature equivalent to the delta temperature provided by the radio frequency signal without requiring a signal having a power level equivalent to the radio frequency signal. A calorimetric calibration system having such temperature generating means eliminates the need for high cost power regulator and heater circuits which generally require power drive levels equivalent to the power levels associated with the radio frequency signal.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
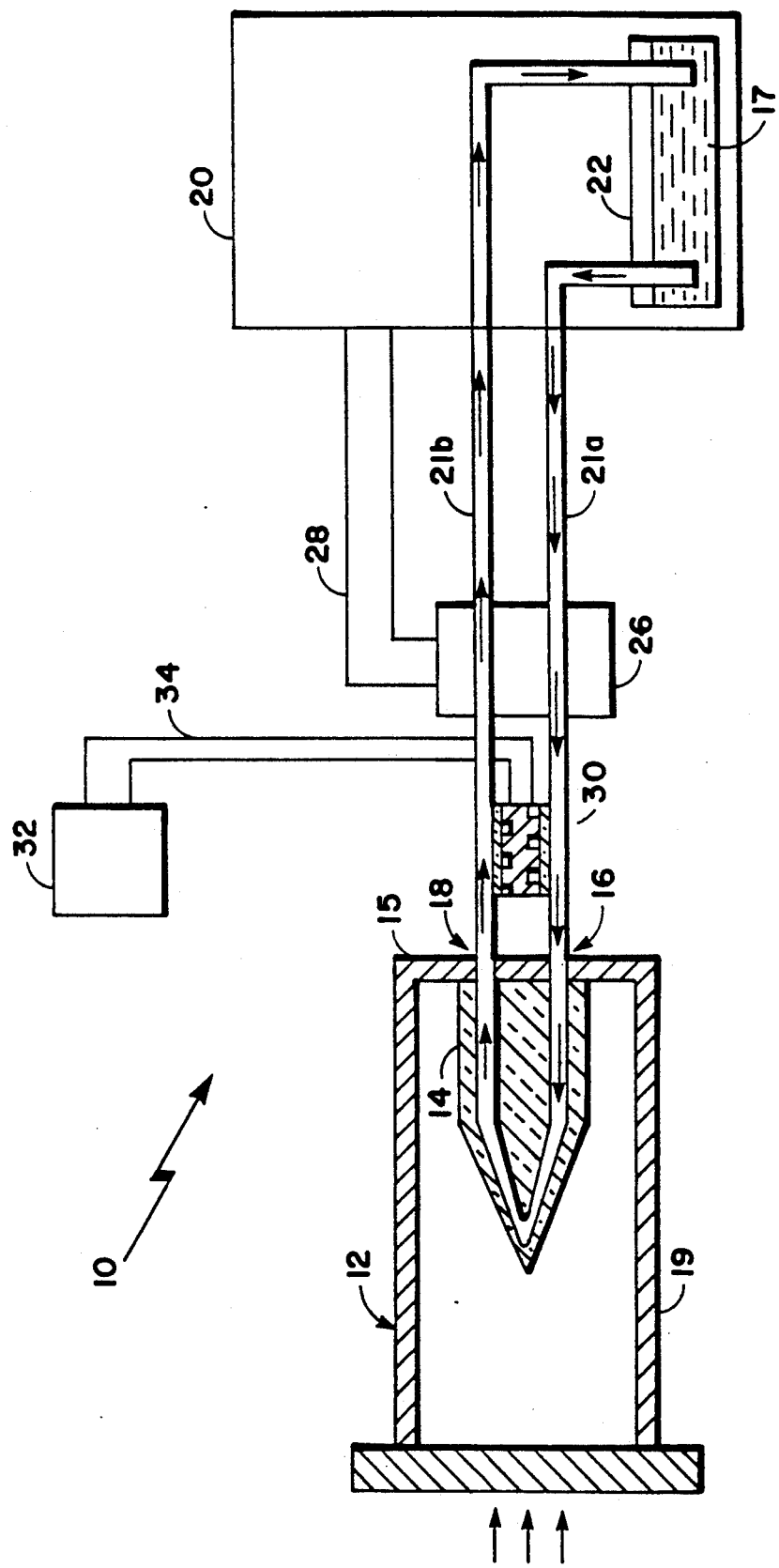
FIG. 1 is a schematic diagram of a calorimetric calibration system.

Referring now to FIG. 1, a calorimetric calibration system 10 is shown to include a waveguide calorimetric waterload 12 having an electromagnetic absorbent element 14 and a pair of apertures or fluid ports 16, 18 disposed at an end portion of a waveguide housing 19.

The electromagnetic absorbent element 14 typically has a portion having a conical shape with a cross-section which gradually tapers to a reduced cross-section at an opposite end. The gradual taper of the absorbent element 14 generally provides a low input standing wave ratio and therefore provides greater absorption of incident energy to the absorbent element. The absorbent element 14 further includes a passageway disposed therethrough, which may be a bore, for allowing the flow of fluid 17 through the element. fluid port 16 allows the fluid, generally water, to be provided to the absorbent element, while fluid port 18 allows the heated fluid to exit the absorbent element 14.

In one embodiment, the tapered electromagnetic energy absorbent element 14 is disposed through a shorting plate 15 disposed at the end of the waveguide housing 19. The absorbent element 14 has a bore extending substantially the length of the element with a hollow tube (not shown) disposed within the bore for allowing a fluid to be provided to the element. The hollow tube is coupled to a flow header assembly having a pair of ports for attachment to appropriate plumbing fixtures. The fluid is provided to a first one of the pair of ports, an inlet port, and is forced under pressure through the hollow tube. The fluid exits the end of the hollow tube and is forced to flow back to the header assembly along the portion of the absorbent element 14 between the tube and the inner wall of the element. The heated fluid then exits an outlet port where it is allowed to cool for recirculation through the termination.

An example of a waterload having the above described configuration which can be used for calorimetric measurements is the waterload described in co-pending application Ser. No. 682,815 filed on Apr. 9, 1991, submitted by the inventors of the present invention and assigned to the assignee of the present invention and incorporated herein by reference.

The waveguide calorimetric waterload 12 is supplied fluid 17 by a calorimetric system controller 20 using conventional pump means (not shown), hoses, tubes, or pipes 21a, 21b for providing the fluid from a storage tank 22, disposed within the controller 20. The fluid 17 is generally provided under pressure by the controller 20 to the waterload through a first pipe 21a here, comprised of a metal, such as copper or other metal materials having good thermal conductivity characteristics. Pipe 21a has a first end portion disposed in a fluid reservoir 22 and a second end portion disposed through aperture 16 and into tapered absorbent element 14 as shown. A second pipe 21b similarly has a first end portion disposed in the fluid reservoir 22 and a second end portion disposed through aperture 18 into tapered absorbent element 14 and coupled to the second end portion of the first pipe 21a. The fluid provided to absorbent element 14 is heated by the incident RF energy and is then returned to the storage tank 22 where it is cooled and recirculated. The calorimetric system controller 20 further includes control instrumentation for activating the system and front panel readouts for indicating differential temperature levels, measured power levels and fluid flow rates. The controller may also include an interface bus for communicating with an external data processor or controller.

The calorimetric calibration system 10 further includes a temperature sensor 26 coupled to the pipes 21a, 21b for sensing the temperature of the fluid 17 both entering and exiting the energy absorbent element 14 of calorimetric waterload 12. The temperature sensors may be thermometers, thermistors, or as shown here, thermocouples. As is known by those of ordinary skill in the art, a thermopile is a device used to measure temperature, generally having a number of series connected thermocouples. A thermocouple generally comprises a pair of dissimilar metals coupled at a pair of junctions to form a continuous electrical circuit. The magnitude and direction of a thermally induced electric current which flows between the two junctions provides an indication of the difference in temperature between the two junctions. A pair of wires 28 from thermopile or temperature sensor 26 provide a signal path from the junctions within the thermopile or temperature sensor 26 to the control instrumentation of calorimetric system controller 20.

The calorimetric calibration system 10 further includes a differential temperature generator 30 coupled between respective inlet and outlet flow pipes 21a, 21b, and intermediate to the temperature sensor 26 and calorimetric waterload 12. One device used for generating a differential temperature is a thermoelectric heat pump which converts an applied electrical signal into heat. The thermoelectric heat pump device or temperature generator 30, as will be described in greater detail below, generally has a pair of outer parallel plates and provides in response to a direct current flow between the plates, a difference in temperature between one of the plate surfaces of the heat pump device or temperature generator 30 and the other plate of the heat pump or device or temperature generator 30 with the direction of temperature differential being related to the direction of the current flow. A power supply 32 supplies, via wires 34, an appropriate direct current to generate a desired temperature differential to a fluid circulating through the inlet and outlet flow pipes 21a, 21b.

In performing the calibration procedure, the pressurized fluid here, water is provided to the calorimetric calibration system 10 in a non-circulating condition. The water disposed within the waterload 12 and the pipes 21a, 21b is allowed to remain in a relatively stationary position, so as not to carry the temperature provided by the thermoelectric heat pump device or temperature generator 30 away from the thermopile sensing device or temperature sensor 26. A current signal from power supply 32 is provided to the thermal electric heat pump device or temperature generator 30 until the desired temperature differential sensed by thermopile or temperature sensor 26 is provided. The temperature differential is generally related to the RF power expected to be provided by the RF source to be measured. A display indicator of system controller 20 indicates when the desired delta temperature has been detected by the thermopile sensing device or temperature sensor 26 and a second display indicator concurrently provides an indication of the power level which corresponds to the detected temperature differential provided by the thermoelectric heat pump device or temperature generator 30. At this juncture the system 10 is calibrated to measure incident RF power applied to the waterload 12 or other equivalent microwave devices.

That is, upon completion of the calorimetric calibration procedure, the RF power source to be measured is attached to the calorimetric waterload 12. The calorimetric system controller 20 is activated to provide the pressurized water to the calorimetric waterload 12 at a desired flow rate and the radio frequency power signal desired to be measured is then applied to the waterload 12. When the display indicators of system controller 20 indicate that a steady state condition of the temperature of the fluid flowing through the pipes 21a, 21b has been reached, the temperature differential between the inlet and outlet pipes is sensed by the temperature sensor 26. The magnitude of the temperature differential is sent to the system controller 20 and indicated on the display readout (not shown) and the associated power is indicated. During the application of RF power to the calorimetric waterload 12, the thermoelectric heat pump device 30 is generally preferred to be removed from the inlet and outlet pipes 21a, 21b so as not to provide a heat sink for the heat generated by the incident RF power.

In circumstances where the power level of the source to be measured is unknown, the temperature differential provided by thermoelectric heat pump device 30 is selected to be in the operating range of sensing thermopile 26. If, during the measurement of the RF power, a differential temperature is provided that is significantly different than the delta temperature selected for calibrating the system, the system may be recalibrated at a new delta temperature which is closer to the value of delta temperature provided by the RF power measurement.

Figure 2A:
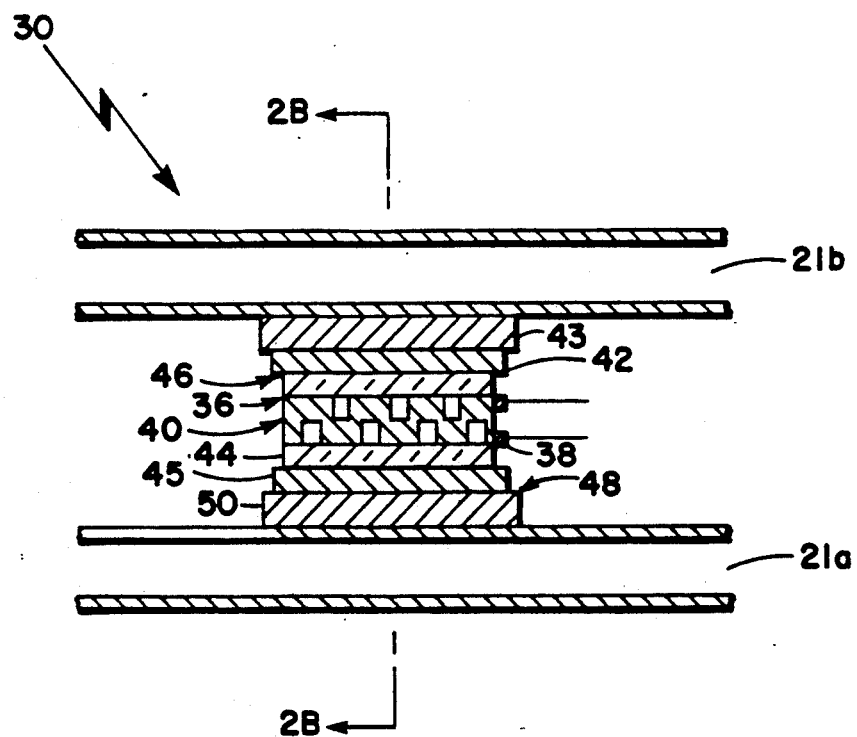
FIG. 2A is a cross-sectional view of a thermoelectric temperature device disposed between inlet and outlet flow pipes.
Figure 2B:
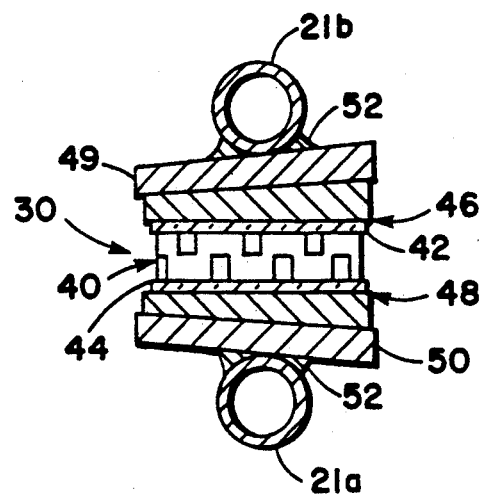
FIG. 2B is a cross-sectional view taken along line 2B—2B of FIG. 2A.

Referring now to FIGS. 2A and 2B, a thermoelectric heat pump 30 is shown disposed between the inlet pipe 21a and outlet tube 21b. As mentioned above the inlet pipe 21a is fed a source of lower temperature fluid from a storage tank to a waterload where the fluid is generally heated by the incident RF power desired to be measured. The outlet pipe 21b provides a path for the heated fluid to be returned to the storage tank to be cooled and then recirculated. The thermoelectric heat pump 30 generally includes a pair of surfaces 36,38 having a plurality of thermocouples 40 disposed therebetween. The thermocouples 40 each contain a series of at least two different metals bonded together on both ends (not shown) which form a pair of heat exchange surfaces 36,38. When a voltage potential is applied across the series of thermocouples 40, one surface 36 becomes cold relative to the other surface 38. On the other hand, if the voltage potential is reversed with respect to the surfaces, surface 36 would become hot with respect to the other surface 38. This characteristic, known as the Peltier effect occurs when two dissimilar metals are connected in series with a source of electromotive force (emf) which establishes a current in the circuit. The current flow causes one junction to become heated and the other to be cooled. This effect is distinct from the heating of both metals by the current due to their resistance. The rate of heat flow is, in general, proportional to the current but depends upon both temperature and the materials at the junction. When the current traverses the series circuit of dissimilar metals, a first junction is heated while the second junction is cooled. Therefore, the hot and cold junctions are not generated by the current, but are, more or less, interchanged by the current flow. One such heat pump for use as a thermoelectric device 30 includes a plurality of here, seventy-one thermocouples, each element 0.1041 in length and 1.4 mm square in cross-section disposed between a pair of ceramic insulator plates 42, 44. The thermoelectric material is here, a quaternary alloy of bismuth, tellurium, selenium, and antimony with small amounts of dopants, processed to provide an oriented polycrystalline ingot with excellent anisotropic thermoelectric properties. The ceramic insulated plates 42, 44 provide electrical insulation and concomitantly a relatively high thermal conduction characteristic. The pair of plates 42, 44 are here, plated or tinned with respective conductive layers 46, 48 to provide a surface for facilitating the soldering of the heat pump 30 to a metal surface. An example of a thermoelectric heat pump device as described, is available from Melcor, Materials Electronics Products Corporation, Trenton, N.J., Product No. CP-1.4-71-10 although any one of a number of alternative thermoele-tric heat pump devices could also be used.

A pair of thermally conductive plates 43, 45 are generally disposed between respective sides of conductive layers 46 and 48 of the thermoelectric heat pump device 30 and pipe plates 49, 50. The thermally conductive plates 43, 45 are comprised of a metal, such as copper or other metal materials having good thermal conductivity characteristics and provide a low loss and reliable thermal path between the ceramic insulator plates 42, 44 to the inlet and outlet pipes 21a, 21b carrying the fluid 17.

The size of the thermal electric heat pump device 30 required to be used in a calorimetric power measurement system as described, is generally related to the size of the inlet and outlet pipes 21a, 21b. For very high power calorimetric measurements, a larger volume of fluid may be needed for dissipating the heat generated by the incident RF power. In such cases, the inlet and outlet pipes 21a, 21b may be required to have an increased diameter. However, in order to adequately provide a delta temperature to the fluid disposed in the increased diameter pipes, a thermoelectric heat pump device having an increased surface area and a greater number of thermocouples may be required. Alternatively, a plurality of heat pump devices may be disposed between the pipes 21a, 21b and electrically connected in series.

The pipe plates 49, 50 are shown here, having a wedge shaped non-uniform thickness such that the thermoelectric heat pump device 30 is allowed to be mechanically engaged and disengaged from the pipe plates 49, 50. As mentioned earlier, the heat pump device 30 is generally desired to be thermally isolated and mechanically disengaged during the measurement of RF power. The wedge shaped thermally conductive plates 43, 45 in combination with pipe plates 49, 50 facilitate the insertion and removal of the heat pump device 30 from inlet and outlet pipes 21a, 21b. The mechanical connection should be made such that a reliable thermal path is provided. This is generally true whether the heat pump device 30 is used as either a delta temperature generator or as a thermopile sensing device. The pipe plates 49, 50 are shown here soldered or brazed directly to the inlet or outlet pipes 21a, 21b using a solder 51 here, lead/tin solder, in order to provide a low loss thermal path between the device 30 and the pipes 21a, 21b carrying the fluid 17.

The thermoelectric heat pump device 30 is desired to be periodically calibrated using a temperature measurement device which has been verified against a measurement standard traceable to NIST. The thermoelectric device 30 may include a small opening between each pair of ceramic plates 42, 44 and thermally conductive plates 43, 45 for allowing the attachment of a high precision temperature measurement device.

Figure 3:
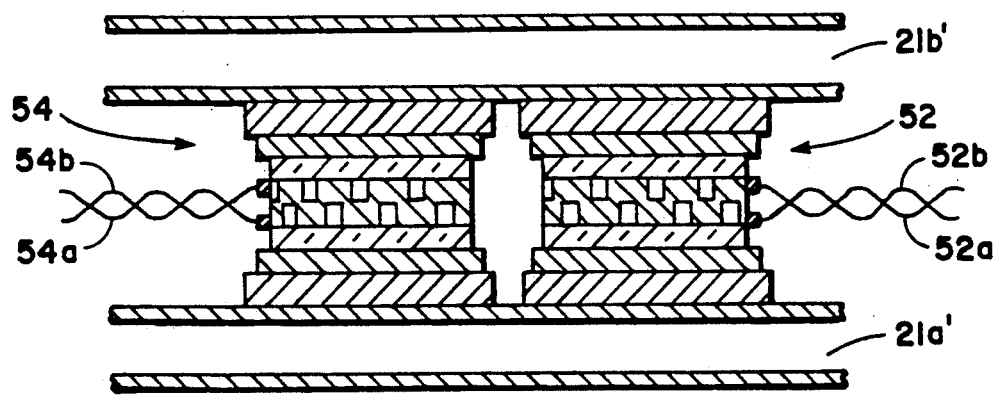
FIG. 3 is a cross-sectional view of a pair of thermoelectric temperature devices used as temperature sensing and delta temperature generator devices respectively.

Referring now to FIG. 3, a pair of thermoelectric heat pump devices 52, 54 for example, a pair of the above described Melcor thermoelectric devices, are shown disposed between an inlet pipe 21a and outlet pipe 21b'.

The first one of the pair of heat pump devices 52 is used here as a temperature sensing device. In operation, a temperature difference between the inlet and outlet pipes 21a', 21b' is coupled to the opposite surfaces of the device 52. This temperature difference, when provided to the plurality of thermocouples generates a voltage potential which is provided to the calorimetric controller via wires 52a, 52b.

The second one of the pair of thermoelectric heat pump devices 54 is used as a temperature differential generator in conjunction with the description of the heat pump device as shown in FIG. 2 and is fed a current to provide the delta temperature via wires 54a, 54b.

Figure 4:
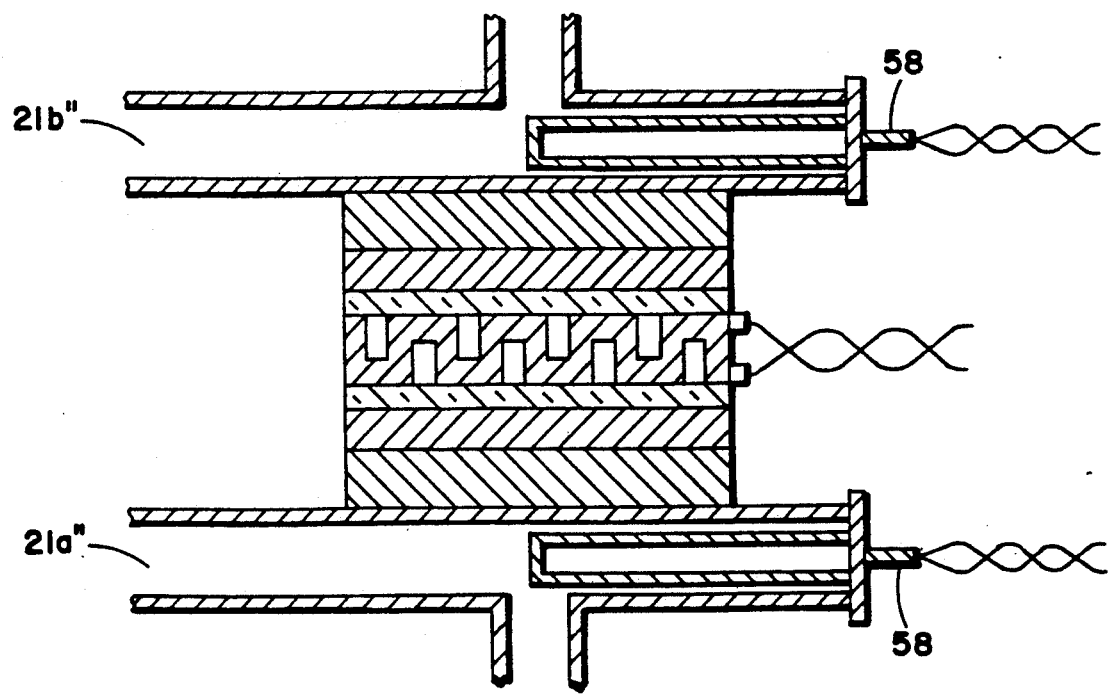
FIG. 4 is a cross-sectional view of an alternative embodiment of a thermoelectric temperature device used for temperature sensing and delta temperature generation.

Referring now to FIG. 4, an alternate embodiment of a temperature sensing and delta temperature generator configuration is shown. In this arrangement a pair of devices which have a defined resistive characteristic as a function of temperature, hereinafter, resistive temperature devices (RTDs) or thermistors 56, 58 are shown disposed at ends of the inlet and outlet pipes 21a'', 21b'' for sensing the temperature of the fluid at their respective locations. The use of resistive temperature devices in this manner is generally preferred to the above described temperature heat pump device embodiment since the RTD's are disposed in direct contact with the fluid and therefore will generally provide a more accurate measurement of the temperature of the fluid.

Having described preferred embodiments of the invention, it will be apparent to one of ordinary skill in the art that other embodiments incorporating its concept may be used. It is believed, therefore, that this invention should not be restricted to the disclosed embodiment but rather should be limited only by the spirit and scope of the appended claims.

What is claimed is:

1. An apparatus, comprising:
means for conveying a fluid from a controller having a first path for receiving said fluid from a fluid source and a second path for returning said fluid to said fluid source and an RF absorbent element having a passageway through said element and an inlet port coupled to said first path of said conveying means and an outlet port coupled to said second path of said conveying means; and
a thermoelectric device comprising:
a pair of ceramic plates, each of said pair of plates having a conductive layer disposed over outer surfaces of the plates and coupled to respective ones of said first and second paths of said means for conveying a fluid; and
a plurality of thermocouples comprising an alloy of bismuth and antimony disposed between said pair of plates.

2. A calorimetric system comprising:
absorbent means for receiving a radio frequency signal at a first power level and for dissipating said signal within a fluid, said absorbent means comprising an inlet port for receiving said fluid and an outlet port for allowing said fluid to exit said absorbent means;
means for conveying said fluid through said absorbent means having a first path for receiving said fluid from a controlled fluid source and a second path for returning said fluid to said fluid source;
sensing means for sensing a difference in temperature and coupled between said first and second paths; and
temperature generating means, coupled to said first and second paths between said absorbent means and said sensing means, for providing a difference in temperature between said first and second paths, said temperature generating means being responsive to a signal at a second power level, with said second power level being less than said first power level of said radio frequency signal.

3. The calorimetric calibration system, as recited in claim 2, wherein said absorbent means is a waterload.

4. The calorimetric calibration systems, as recited in claim 3, wherein said temperature generating means comprises a ceramic insulated thermoelectric module.

* * * * *